(12) United States Patent
Koerner (10) Patent No.: US 7,170,359 B2
(45) Date of Patent: Jan. 30, 2007

(54) AMPLITUDE-CONTROLLED OSCILLATOR CIRCUIT AND METHOD FOR OPERATING AN AMPLITUDE-CONTROLLED OSCILLATOR CIRCUIT

(75) Inventor: Heiko Koerner, Soeding (AT)

(73) Assignee: Infineon Technologies AG, Munich (DE)

( * ) Notice: Subject to any disclaimer, the term of this patent is extended or adjusted under 35 U.S.C. 154(b) by 69 days.

(21) Appl. No.: 11/037,381

(22) Filed: Jan. 18, 2005

(65) Prior Publication Data

US 2005/0184766 A1 Aug. 25, 2005

(30) Foreign Application Priority Data

Feb. 3, 2004 (DE) .................. 10-2004-005 261

(51) Int. Cl.
*H03L 5/00* (2006.01)

(52) U.S. Cl. ........................... 331/183; 331/74
(58) Field of Classification Search ............ 331/74, 331/182–183
See application file for complete search history.

(56) References Cited

U.S. PATENT DOCUMENTS 4,245,350 A 1/1981 Moore 6,483,391 B1* 11/2002 Magoon et al. ............ 331/183
6,603,360 B2* 8/2003 Kim et al. ................. 331/1 A
7,023,285 B2* 4/2006 Nord et al. .................. 331/16

OTHER PUBLICATIONS

Mazouffre, O, et al., "A 5 GHz Low-Power Quadrature SiGe VCO with Automatic Amplitude Control," IEEE BCTM, 2003, pp. 57-60.

* cited by examiner

*Primary Examiner*—Robert Pascal
*Assistant Examiner*—James Goodley
(74) *Attorney, Agent, or Firm*—Slater & Matsil, L.L.P.

(57) ABSTRACT

An amplitude-controlled oscillator circuit includes an oscillator for providing a frequency signal having a controllable signal amplitude, a divider circuit for a frequency division of the frequency signal, a minimum amplitude of the frequency signal being associated to the divider circuit and the divider circuit being formed to output a divided frequency signal having a predetermined quality when the signal amplitude is greater than or equal to the minimum amplitude. In addition, the amplitude-controlled oscillator circuit includes a controller for controlling the signal amplitude of the frequency signal, the controller being formed to control the signal amplitude such that it is greater than or equal to the minimum amplitude. It is possible by means of such an amplitude-controlled oscillator circuit to ensure in a simple and low-cost manner that the divided frequency signal has a predetermined quality for example within a wide temperature range.

17 Claims, 7 Drawing Sheets

SIMULATION OSCILLATOR WITH CONTROL

PRIOR ART

FIG 7A

PRIOR ART

FIG 7B

AMPLITUDE-CONTROLLED OSCILLATOR CIRCUIT AND METHOD FOR OPERATING AN AMPLITUDE-CONTROLLED OSCILLATOR CIRCUIT

CROSS-REFERENCE TO RELATED APPLICATION

This application claims priority from German Patent Application No. 10 2004 005 261.1, which was filed on Feb. 3, 2004, and is incorporated herein by reference in its entirety.

BACKGROUND OF THE INVENTION

1. Field of the Invention

The present invention relates to an oscillator circuit and the present invention particularly relates to an electronic oscillator circuit, the oscillator amplitude of which is controllable.

2. Description of the Related Art

In LC oscillators, it is often necessary to guarantee a certain output amplitude apart from the frequency. A safe control of circuits downstream of the LC oscillator is to be ensured by such a output amplitude. Such a circuit downstream of an LC oscillator can, for example, be a frequency divider circuit (=divider), as is, for example, illustrated in FIG. 6. The frequency divider circuit 600 includes an input IN for applying a signal having the frequency $f_0$. The input IN of the divider circuit 600 preferably includes a first input terminal 602 and a second input terminal 604 between which a difference signal can be applied. Furthermore, the divider circuit 600 includes a first operating transistor T1, a second operating transistor T2, a third operating transistor T3 and a fourth operating transistor T4. In addition, the divider circuit 600 includes a first current source 606 and a second current source 608. Additionally, the divider circuit 600 includes eight further transistors which in the following description will be referred to as a fifth transistor T5 to a twelfth transistor T12. The transistors here can, for example, be designed as self-locking n-channel enhancement MOSFETs. As an alternative, npn bipolar transistors may also be employed. When MOS transistors are chosen as the operating transistors T1 to T4, they will have an equal relation of channel width W to channel length L. Additionally, the divider circuit 600 includes a first resistor R1, a second resistor R2, a third resistor R3 and a fourth resistor R4. Furthermore, the divider circuit 600 comprises an output OUT having a first output terminal 610 and a second output terminal 612 and a supply voltage terminal 614 and a ground connection 616. An alternating voltage can be tapped between the first output terminal 610 and the second output terminal 612, wherein a frequency $f_0$ of the alternating voltage which can be tapped at the output OUT corresponds to half the frequency $f_0$ of a signal at the input IN.

Figure 6:
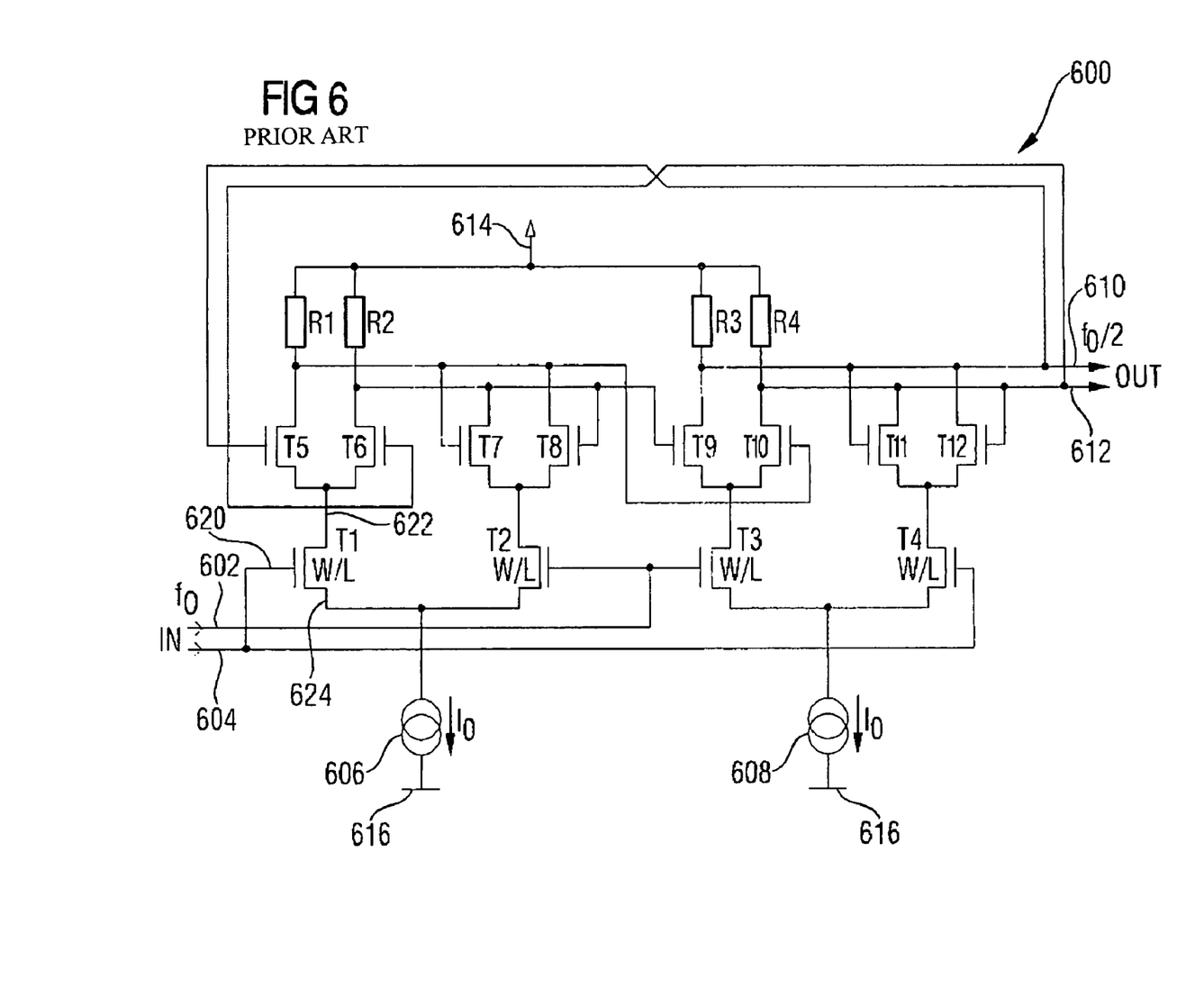
FIG. 6 shows a block diagram of a conventional divider circuit.

Each of the transistors T1 to T12 illustrated in FIG. 6 comprises a control input 620 and a first terminal 622 and a second terminal 624. For reasons of clarity, the control input 620, the first terminal 622 and the second terminal 624 are indicated in FIG. 6 only for the first operating transistor T1. In analogy, the identification of the control terminal 620 and of the first terminal 622 and the second terminal 624, however, also applies to the other transistors T2 to T12 illustrated in FIG. 6, wherein the first terminals 622 of the respective transistors are always formed by the upper terminals illustrated in FIG. 6 and the second terminals 624 of the respective transistors are always formed by the lower terminals. With regard to connecting the above-mentioned elements of the divider circuit 600, the first input terminal 602 of the circuit input IN is conductively connected to the control terminal of the second operating transistor T2 and to the control terminal of the third operating transistor T3. The second input terminal 604 of the circuit input IN is conductively connected to the control terminal 620 of the first operating transistor T1 and to the control terminal of the fourth operating transistor T4. Furthermore, the second terminal 624 of the first operating transistor T1 is conductively connected to the second terminal of the second operating transistor T2. Additionally, the second terminal 624 of the first operating transistor T1 is connected to the ground terminal 616 via the first current source 606 and the second terminal of the third operating transistor T3 is conductively connected to the second terminal of the fourth operating transistor T4. In addition, the second terminal of the third operating transistor T3 is connected to the ground terminal 616 via the second current source 608. Additionally, the second terminal of the fifth transistor T5 and the second terminal of the sixth transistor T6 are conductively connected to the first terminal 620 of the first operating transistor T1. In analogy, the second terminal of the seventh transistor T7 and the second terminal of the eighth transistor T8 are conductively connected to the first terminal of the second operating transistor T2. Also in analogy, the second terminal of the ninth transistor T9 and the second terminal of the tenth transistor T10 are conductively connected to the first terminal of the third operating transistor T3. Furthermore, the second terminal of the eleventh transistor T11 and the second terminal of the twelfth transistor T12 are conductively connected to the first terminal of the fourth operating transistor T4. The first terminal of the fifth transistor T5 is conductively connected to the control terminal of the seventh transistor T7, to the first terminal of the eighth transistor T8, to the control terminal of the tenth transistor T10 and, via the resistor R1, to the supply terminal 614. Furthermore, the first terminal of the sixth transistor T6 is conductively connected to the first terminal of the seventh transistor T7, to the control terminal of the eighth transistor T8, to the control terminal of the ninth transistor T9 and, via the resistor R2, to the supply voltage terminal 614. In addition, the first terminal of the ninth transistor T9 is conductively connected to the first output terminal 610, to the control input of the eleventh transistor T11, to the first terminal of the twelfth transistor T12, to the control terminal of the fifth transistor T5 and, via the resistor R3, to the supply terminal 614. In addition, the first terminal of the tenth transistor T10 is conductively connected to the first terminal of the eleventh transistor T11, to the control terminal of the twelfth transistor T12, to the control terminal of the sixth transistor T6, to the second output terminal 612 and, via the resistor R4, to the supply terminal 614.

In order to bring the divider circuit 600 into operation, a supply voltage is to be applied between the supply terminal 614 and the ground terminal 616, the supply voltage defining a maximal voltage at the output OUT of the divider circuit 600, i.e., between the first output terminal 610 and the second output terminal 612, via the resistors R3 and R4. The operating transistors T1 to T4 can be controlled by a voltage signal to be applied at the input IN, i.e., between the first input terminal 602 and the second input terminal 604, such that a signal at the input IN of the divider circuit 600, having a frequency $f_0$ can be transformed in a manner that a nearly rectangular signal having half the frequency $f_0$ applied at the input IN is output at the output OUT of the divider circuit 600. The level of the rectangular signal basically varies between the potential of the supply voltage terminal 614 and a low voltage level decoupled from the ground potential by the second current source 608. A current $I_0$ flows through the first current source 606 and the second current source 608. It is also to be pointed out here that all the voltages are decoupled with regard to a potential of the ground terminal 616 via corresponding current sources. The potential of the transistors T5 to T12 is thus determined by the potential of the supply terminal 614, while the potential of the operating transistors T1 to T4 is determined by the VCO potential and the voltage between the input terminals 602 and 604.

In order to be able to perform an intended frequency division, a first bistable circuit group of the transistors T1, T2, T5, T6, T7 and T8 and a second bistable circuit group of the transistors T3, T4, T9, T10, T11 and T12 are connected to each other such that the first bistable circuit group controls the second bistable circuit group and vice versa. For such a frequency-division behavior of the divider circuit 600, however, there is a precondition that the operating transistors T1 to T4 and the transistors T5 to T12 nearly have the effect of an ideal switch. This can only be ensured when a voltage amplitude $\hat{U}$ at the input IN is sufficiently large so that the operating transistors T1 to T4 either connect through nearly without any loss or block nearly ideally. If the voltage amplitude $\hat{U}$ between the first input terminal 602 and the second input terminal 604 is not sufficiently large, the operating transistors T1 to T4 will not connect through ideally, the result being a signal at the output OUT of the divider circuit 600, which is affected by partially high level variations partly outside a tolerance region between the ideal levels of zero volt and the supply voltage. If such an output signal with high level variations is then used for another circuit downstream of the divider circuit 600, a perfect function of the downstream circuit cannot be ensured.

Such a behavior of an oscillator circuit is particularly problematic when there is a high temperature dependence of the voltage amplitude $\hat{U}$ of the oscillator at the input IN, i.e. of an amplitude between the first input terminal 602 and the second input terminal 604. With such a high temperature dependence, an error-free functioning of an oscillator circuit having an oscillator and the divider circuit 600 illustrated in FIG. 6 can no longer be ensured. This particularly means that the quality of the frequency-divided signal at the output OUT of the divider circuit 600 is strongly dependent on temperature.

Figure 7A:
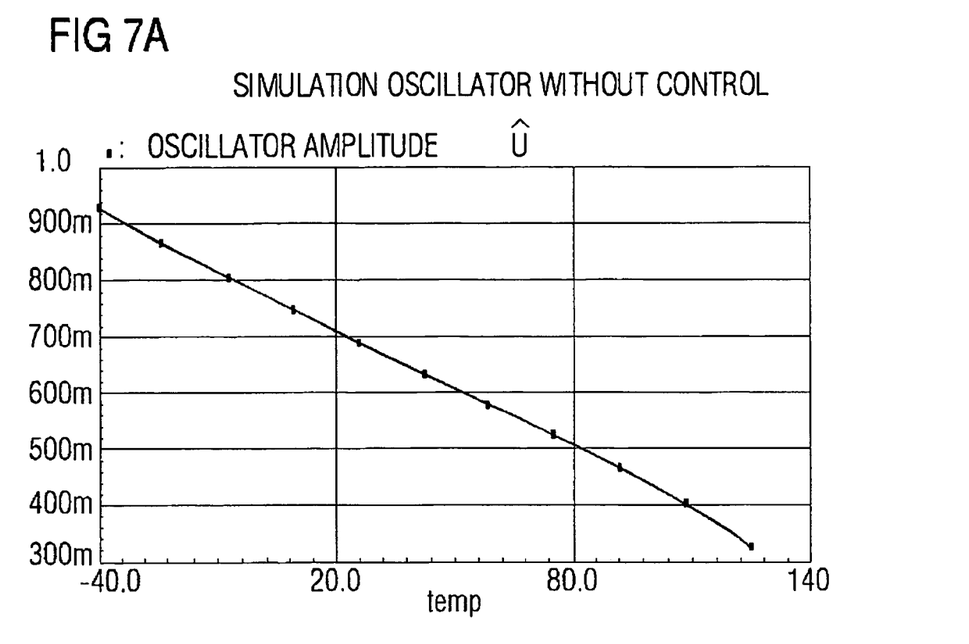
FIGS. 7A and 7B show two simulation diagrams illustrating the oscillator amplitude and the oscillator current against the temperature when using the divider circuit illustrated in FIG. 6.
Figure 7B:
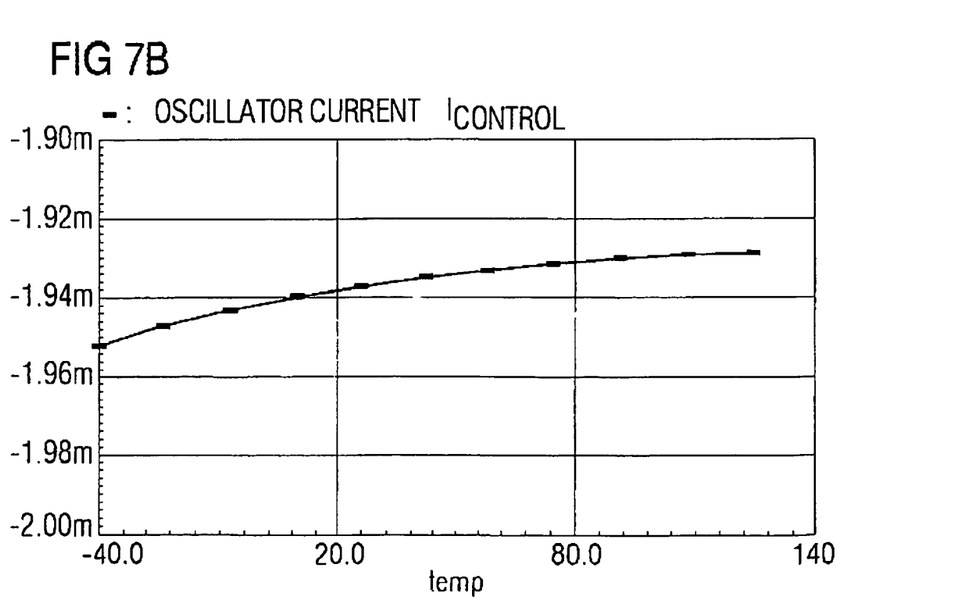

Such a temperature dependence of the oscillator amplitude is illustrated in FIG. 7A. In order to ensure that an oscillator circuit is as temperature-independent as possible, a high but constant current can, for example, be fed to the voltage-controlled oscillator in order to obtain such a high oscillator amplitude $\hat{U}$ still having, after a frequency division by the divider circuit 600, the required quality. Such a required quality of the oscillator amplitude $\hat{U}$ can, for example, be for the level of the oscillator amplitude $\hat{U}$ only to vary within a tolerance region around the two ideal levels mentioned above. A current $I_{control}$ which must be fed in is, for example, illustrated in FIG. 7B. Such a procedure, however, is of the disadvantage that with some temperature ranges, in particular with low temperature ranges where the signal amplitude $\hat{U}$ provided by the oscillator is large enough anyway for a sufficiently precise switching behavior of the divider circuit 600, even without an additional feed current, too large a current is fed to the oscillator, the result being an unnecessary increase in losses.

SUMMARY OF THE INVENTION

It is the object of the present invention to provide a more reliable low-loss oscillator circuit, compared to a conventional oscillator circuit, wherein the oscillator circuit to be provided should additionally be manufacturable at low cost.

In accordance with a first aspect, the present invention provides an amplitude-controlled oscillator circuit having: an oscillator for providing a frequency signal having a controllable signal amplitude; a divider circuit for a frequency division of the frequency signal, a minimum amplitude of the frequency signal being associated to the divider circuit and the divider circuit being formed to output a divided frequency signal having a predetermined quality when the signal amplitude is larger than or equal to the minimum amplitude; and control means for controlling the signal amplitude of the frequency signal, the control means being formed to control the signal amplitude such that it is larger than or equal to the minimum amplitude.

In accordance with a second aspect, the present invention provides a phase-locked loop having an above-mentioned amplitude-controlled oscillator circuit.

In accordance with a third aspect, the present invention provides a method for operating an amplitude-controlled oscillator circuit, the amplitude-controlled oscillator circuit including an oscillator for providing a frequency signal having a controllable signal amplitude, a divider circuit for a frequency division of the frequency signal, a minimum amplitude of the frequency signal being associated to the divider circuit and the divider circuit being formed to output a divided frequency signal having a predetermined quality when the signal amplitude is larger than or equal to the minimum amplitude, and control means for controlling the signal amplitude of the frequency signal, the control means being formed to control the signal amplitude such that it is larger than or equal to the minimum amplitude, having the following steps: providing the frequency signal using an oscillator; dividing the frequency signal using the divider circuit to provide a divided frequency signal having a poorer quality than the predetermined quality; and controlling the signal amplitude such that the divided frequency signal achieves the predetermined quality.

In accordance with a fourth aspect, the present invention provides a computer program having a program code for performing the above-mentioned method when the program runs on a computer.

The present invention is based on the finding that the divider circuit can output a divided frequency signal having a predetermined quality when a frequency signal fed to the divider circuit has a signal amplitude larger than a minimum amplitude. Thus, the signal amplitude of the frequency signal provided by the oscillator can be controlled by control means such that the signal amplitude of the frequency signal is greater than or equal to the minimum amplitude.

An oscillator circuit designed in this way has the advantage that it can be ensured by means of the control means that the signal amplitude, output by the oscillator, of the frequency signal will always be at least such that it is greater than or equal to the minimum amplitude the divider circuit requires for outputting a divided frequency signal with the predetermined quality. Impacts of temperature can, for example, be compensated by such a control by increasing for example the signal amplitude of the frequency signal output by the oscillator in certain situations by suitable measures.

According to a preferred embodiment of the present invention, the divider circuit comprises amplitude detection means by means of which it is possible to use the divider circuit for detecting the signal amplitude of the oscillator to output an amplitude detection signal. An oscillator circuit designed in this way is of advantage in that the amplitude detection signal can be provided without an additional detection circuit. In contrast, the divider circuit already present in the oscillator circuit can be used as a detector circuit through a simple modification, which is how the manufacturing costs can be reduced compared to a separate detector circuit. This is especially the result of the fact that the number of elements required for detecting the signal amplitude of the frequency signal can be reduced when using the divider circuit in contrast to a separate detector circuit.

Furthermore, the frequency signal may include a direct component in certain situations. According to a preferred embodiment of the present invention, the divider circuit can additionally include direct component detection means by means of which a detection of the direct component can take place. An oscillator circuit designed in this way offers the additional advantage that not only deviations of the signal amplitude of the frequency signal can be detected but also offset direct voltage component of the frequency signal can be detected, the result being that the field of application of an oscillator circuit designed in this way can be increased considerably compared to a conventional oscillator circuit.

According to another embodiment of the present invention, the amplitude detection means can include a transistor having a control terminal and a first and a second controlled terminal and the direct component detection means can include a reference transistor having a control terminal and a first and a second controlled terminal, the control terminal of the transistor being coupled to the control terminal of the reference transistor and the first controlled terminal of the transistor being coupled to the first controlled terminal of the reference transistor. Thus, it is possible to detect a direct voltage operating point of the transistor using a resistance of the reference transistor. An oscillator circuit designed in this way thus offers the advantage that a direct component of the frequency signal can be detected by only using tapping points for the amplitude detection signal and by using a single reference transistor which can be manufactured at low cost. An oscillator circuit designed in this way thus offers, compared to a conventional oscillator circuit, a considerably increased flexibility in the field of application with only little additional expenditure.

According to another preferred embodiment, the divider circuit includes a current source for providing a current through the transistor and a reference current source for providing a reference current through the reference transistor, a relation of the reference current and the current being dependent on a relation of a quotient of channel width divided by channel length of the reference transistor and a quotient of channel width divided by channel length of the transistor. It is possible by means of this to conduct a low reference current through the reference transistor, compared to the current through the transistor, when selecting a low quotient of channel width and channel length in the reference transistor in contrast to a corresponding quotient of channel width and channel length of the transistor. This offers the advantage that, by using low currents, the power loss resulting from the current flow through the reference transistor can be minimized, the result being that an oscillator circuit offering great flexibility compared to a conventional oscillator circuit can be realized with small additional losses.

BRIEF DESCRIPTION OF THE DRAWINGS

A preferred embodiment of the present invention will be detailed subsequently referring to the appended drawings, in which.

DESCRIPTION OF THE PREFERRED EMBODIMENTS

In the subsequent description of the preferred embodiment of the present invention the same or similar reference numerals will be used for elements having the same effect and being illustrated in the different drawings, wherein a repeated description of these elements will be omitted.

Figure 1:
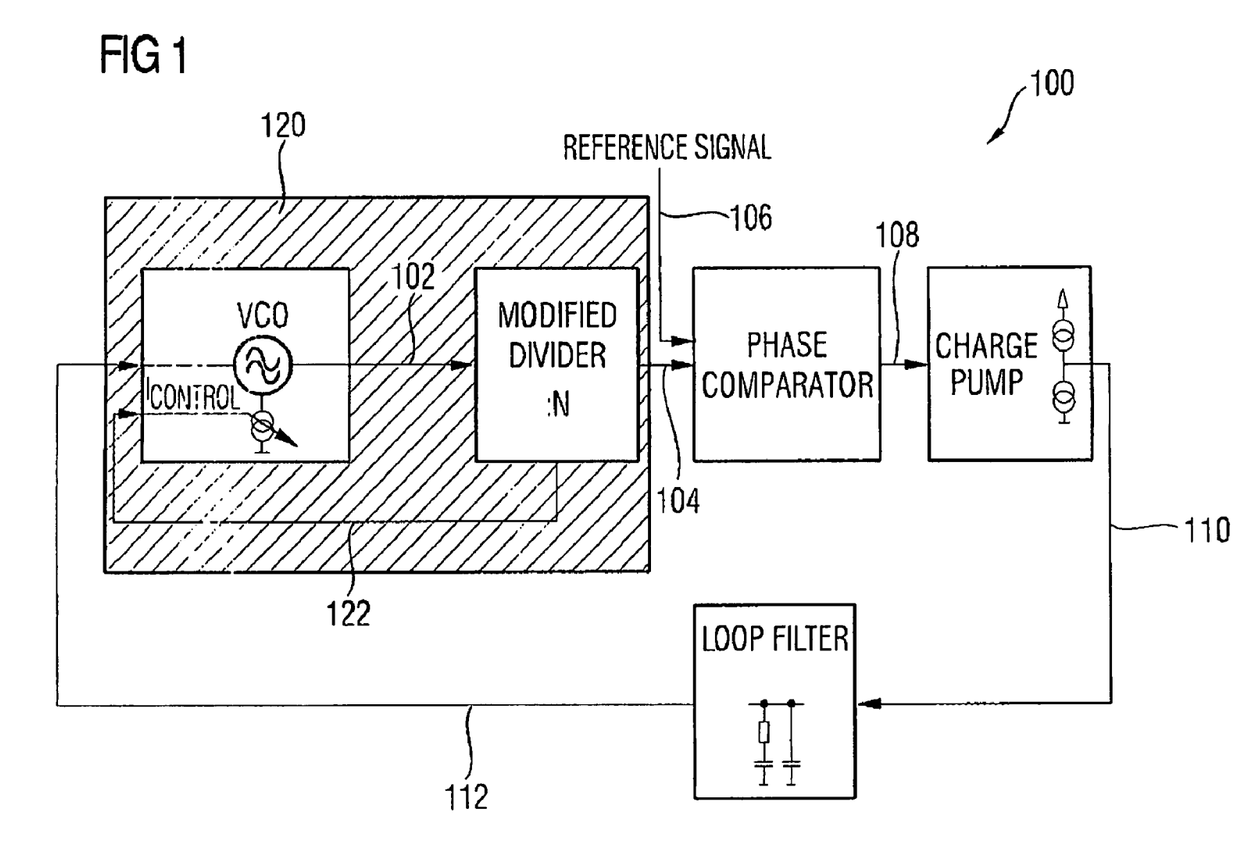
FIG. 1 shows a block diagram of a phase-locked loop having an inventive amplitude-controlled oscillator circuit.

FIG. 1 shows a block diagram of a phase-locked loop. The phase-locked loop 100 includes a VCO (VCO=voltage controlled oscillator), a divider circuit (=modified divider), a phase comparator, a charge pump and a loop filter. The voltage-controlled oscillator VCO can output a frequency signal 102 to the divider circuit. The divider circuit can divide the frequency signal 102 received by the factor N and output a divided frequency signal 104 determined therefrom to the phase comparator. The phase comparator can compare the received divided frequency signal 104 to a reference frequency signal 106 to establish a comparison signal 108 which can be output to the charge pump. The charge pump increases the power of the comparison signal 108 obtained from the phase comparator and can output a charge pump signal 110 to the loop filter. The loop filter can establish, from the charge pump signal 110, a filter signal 112 which can then be directly output to the voltage-controlled oscillator VCO for controlling the frequency thereof. In order to allow an error-free function of the phase comparator, it must be ensured that the divided frequency signal 104 output by the divider circuit has a predetermined quality. This predetermined quality can, for example, be that the divided frequency signal 104 is a rectangular signal having a predefined "high" and a predefined "low" level, the level values of which basically maximally vary within a predetermined tolerance range between the predefined "high" and "low" levels. The "high" level thus, for example, basically corresponds to the supply voltage Vdd appliable to the oscillator circuit, while the "low" level corresponds to a voltage level which is, for example, 500 mV below the "high" level. The signal (rectangular signal) "floats" below the supply level Vdd with a peak-to-peak voltage between the "high" and the "low" level of 500 mV and is, as has been described above, decoupled with regard to the ground potential by the second current source 608. As has been described above, it is, however, necessary here for the frequency signal 102 output by the voltage-controlled oscillator VCO to have a signal amplitude which is greater than or equal to a predetermined minimum amplitude of, for example, 200 mV. In order to ensure that the frequency signal 102 output by the voltage-controlled oscillator has such a high signal amplitude, the amplitude-controlled oscillator circuit can, according to an embodiment of the present invention, include an amplitude control 120 in which already in the divider circuit an amplitude control signal 122 can be established which can be fed to the voltage-controlled oscillator VCO via a control current $I_{control}$. Only the signal amplitude of the frequency signal 102 can be controlled by the amplitude control signal 122; the frequency or phase of the frequency signal 102 can be controlled by the control branch of the frequency signal with the phase comparator, the charge pump and the loop filter. As will be illustrated hereinafter, more components are arranged in the control branch of the amplitude control 120.

Figure 2:
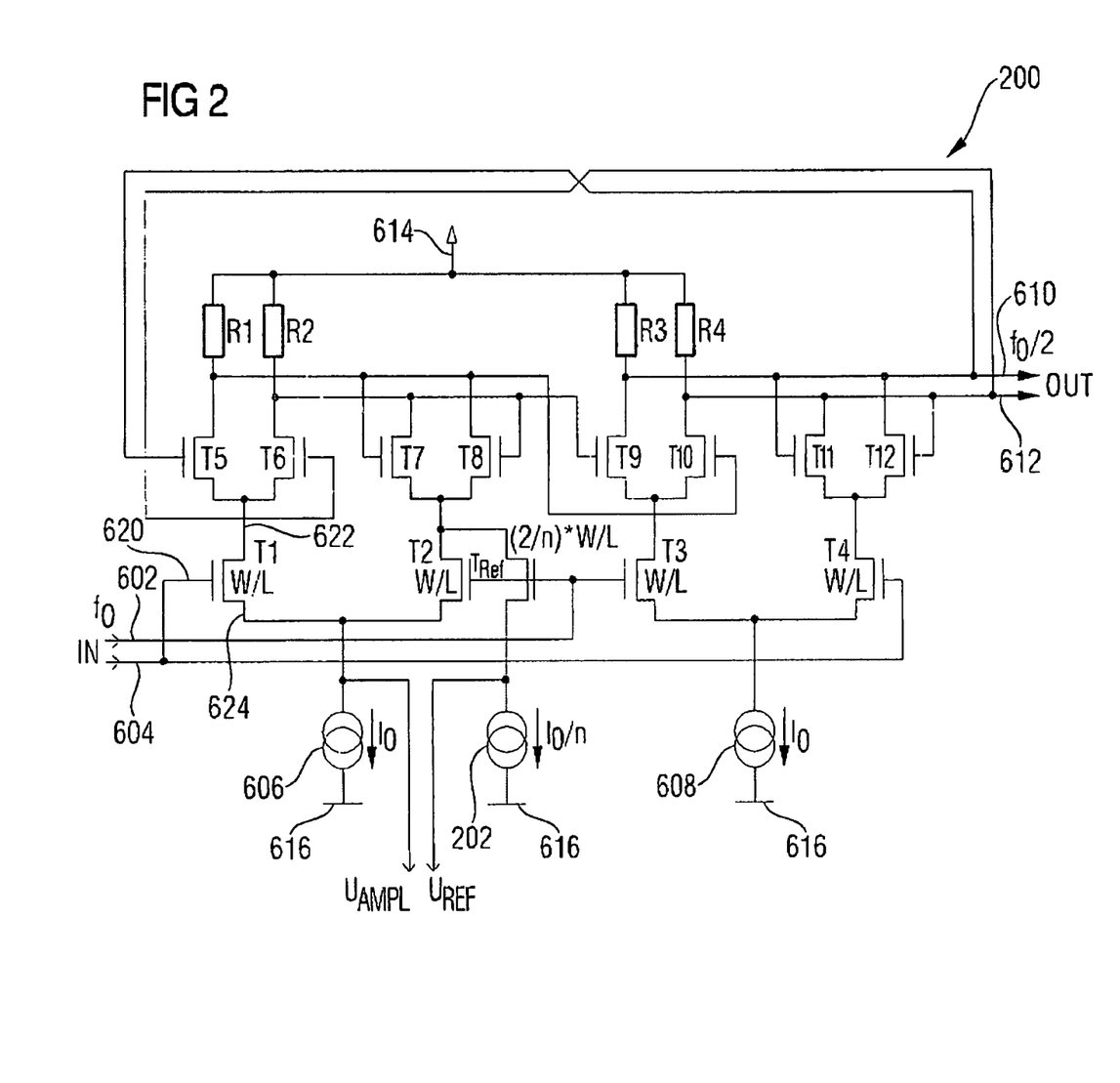
FIG. 2 is an illustration of an embodiment of a divider circuit of the inventive amplitude-controlled oscillator circuit.

FIG. 2 shows a preferred embodiment of a divider circuit. The divider circuit 200 corresponds to the divider circuit (=modified divider) of FIG. 1. Furthermore, the divider circuit 200 illustrated in FIG. 2 corresponds, except for some distinguishing features detailed below, to the conventional divider circuit 600 illustrated in FIG. 6. A detailed description of matching features of the divider circuit 200 and the divider circuit 600 of FIG. 6 is dispensed with here. Compared to the divider circuit 600 illustrated in FIG. 6, a tapping point for tapping an amplitude detection voltage $U_{ampl}$ with regard to a potential of the ground terminal 616 is provided in the divider circuit 200 illustrated in FIG. 2, the tapping point for tapping the amplitude detection voltage $U_{ampl}$ being conductively connected to the second terminal 624 of the second operating transistor T2. The potential of the tapping point for tapping the amplitude detection voltage $U_{ampl}$ is thus determined by the potential of the first input terminal 602 and by the voltage drop (gate-source voltage drop) at the second operating transistor T2 and a current through the first current source 606. In addition, the divider circuit 200 comprises a reference transistor $T_{ref}$, the control terminal of which is connected to the first input terminal 602, the first terminal of which is connected to the first terminal of the second operating transistor T2 and the second terminal of which is connected to the ground terminal 616 via a reference current source 202. Additionally, the divider circuit 200 comprises a tapping point for tapping a reference voltage $U_{ref}$ with regard to a potential of the ground terminal 616 connected to the second terminal of the reference transistor $T_{ref}$. The potential of the tapping point for tapping the reference voltage $U_{ref}$ is thus determined by the potential of the first input terminal 602 and the voltage drop (gate-source voltage drop) at the reference transistor $T_{ref}$ and a current through a reference current source 202. It is thus possible by means of a divider circuit 200 modified in this way, compared to a conventional divider circuit 600, to achieve a considerable increase in the usability of the divider circuit 200 by minimally changing the conventional divider circuit 600 simply by using a reference transistor $T_{ref}$ and by providing two voltage tapping possibilities for the amplitude detection voltage $U_{ampl}$ and the reference voltage $U_{ref}$.

In addition, the second operating transistor T2 and the reference transistor $T_{ref}$ should be designed such that they have the same current density when operating the divider current 200. It must be taken into consideration here that, in order to keep the power loss as small as possible, the current flowing through the reference transistor $T_{ref}$ is to be kept as small as possible. This can particularly be realized when the reference transistor $T_{ref}$ has a quotient of channel width W to channel length L of the conductive channel of the transistor for example formed in MOS technology, which is, for example, smaller by a factor $2/n$ ($n \in R$, $n>2$) than a relation of channel width W to channel length L of the second operating transistor T2 which is, for example, also formed in MOS technology (without excluding the generalization, a selection of $n \leq 2$ would, however, also be possible). For a reference transistor $T_{ref}$ designed in this way, it must be ensured that the current impressed on the reference transistor $T_{ref}$ by the reference current source 202 is also smaller by the factor n than the current $I_0$ impressed on the first operating transistor T1 and the second operating transistor T2 by the first current source 606.

If the criterion of an equal current density in the reference transistor $T_{ref}$ and the second operating transistor T2 is kept to, the direct component of the voltage at the input IN of the divider circuit 200 can be established via the reference transistor $T_{ref}$. This direct component of the voltage at the input IN is in a particular predefined context to the operating point of the second operating transistor T2, wherein this operating point voltage can be established by using the reference transistor $T_{ref}$ and can be output via the reference voltage $U_{ref}$. In contrast, it can be established by means of the amplitude detection voltage $U_{ampl}$ what the signal amplitude U of the frequency signal at the input IN is. In the divider circuit 200 illustrated in FIG. 2, the amplitude detection voltage $U_{ampl}$ is tapped at the base of the difference stage comprising the first operating transistor T1 and the second operating transistor T2. A rectifying effect of the difference stage is thus made use of at this voltage and the result is, approximately, a rectified voltage of the voltage at the input IN. On the other hand, the reference voltage $U_{ref}$ simulating the direct voltage operating point (DC operating point) of the second operating transistor T2 is generated in the divider circuit 200 via the smaller reference transistor $T_{ref}$. A current $I_0/n$ generated in the reference current source 202 passes through this reference transistor $T_{ref}$. As has already been mentioned, it is important that the current density in the reference transistor $T_{ref}$ be the same as in the respective operating transistors T1 to T4. This context is expressed by the relation n. In order to keep the power loss as small as possible, a great value for n is sought, but only up to a level where edge effects of the operating transistors T1 to T4 used start interfering. A stability of the tappable amplitude detection voltage $U_{ampl}$ and the reference voltage $U_{ref}$, for example, with regard to temperature and the supply voltage can be achieved in this way by designing the divider circuit 200, i.e. in particular by the constant current density.

Figure 3:
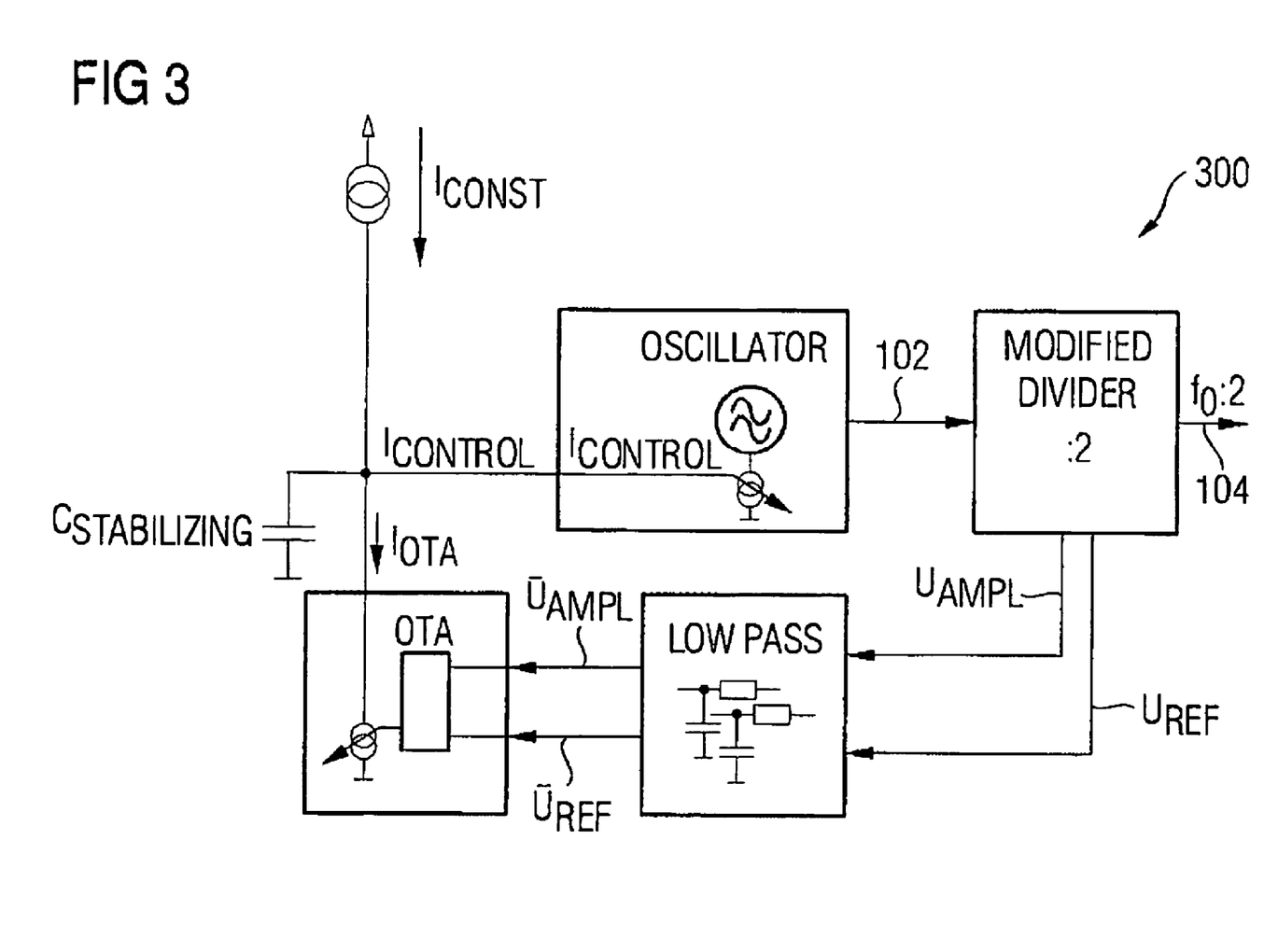
FIG. 3 shows a block diagram of an embodiment of an amplitude-controlled oscillator circuit comprising the divider circuit illustrated in FIG. 2.

FIG. 3 shows a block diagram of the amplitude control illustrated in FIG. 2 with the amplitude control signal 122. The amplitude-controlled oscillator circuit 300 illustrated in FIG. 3 particularly represents a detailed block diagram of the amplitude control 120 illustrated in FIG. 1. The amplitude-controlled oscillator circuit illustrated in FIG. 3 in turn includes the oscillator, the divider circuit (=modified divider), a low-pass filter and an OTA amplifier (OTA=operational transconductance amplifier). As has already been illustrated in FIG. 1, the oscillator provides the frequency signal 102 to the modified divider. The frequency signal 102 thus has a time-depending signal amplitude U(t) which is characterized over the time t by the following formula:

$$U(t) = \hat{U} \cdot \sin(2\omega f_0 t).$$

The oscillator signal amplitude Û here is proportional to the control current $I_{control}$. A frequency division to half the frequency of the frequency signal 102 preferably takes place in the divider circuit. This is illustrated in FIG. 3 at the output of the divider circuit by means of the term $f_0/2$ indicating half the frequency $f_0/2$ of the divided frequency signal 104 with regard to the frequency $f_0$ of the frequency signal 102. In addition, the amplitude detection voltage $U_{ampl}$ can be decoupled from the divider circuit, the voltage being proportional to the rectified signal amplitude by the following context:

$$U_{ampl} = |\hat{U} \cdot \sin(2\omega f_0 t)|.$$

Furthermore, the reference voltage $U_{ref}$ can be decoupled from the divider circuit 200. The amplitude detection voltage $U_{ampl}$ and the reference voltage $U_{ref}$ can each be fed to an individual low-pass filter branch of the low-pass filter, wherein a smoothed amplitude detection voltage $\overline{U}_{ampl}$ can be determined from the amplitude detection voltage $U_{ampl}$ and a smoothed reference voltage $\overline{U}_{ref}$ can be determined from the reference voltage $U_{ref}$. The smoothed amplitude detection voltage $\overline{U}_{ampl}$ is always proportional to the signal amplitude Û of the frequency signal 102 and the smoothed reference voltage $\overline{U}_{ref}$ is constant. In the OTA amplifier, the difference of the smoothed amplitude detection voltage 0ampl and the smoothed reference voltage IJref can be formed for example and weighted with a constant factor g. A current IOTA with the following context can be determined from this:

$$I_{OTA} = g \cdot (\overline{U}_{ampl} - \overline{U}_{ref}).$$

Alternatively, the amplitude detection signal $U_{ampl}$ and the direction component detection signal $U_{ref}$ can first be used for providing the control signal $I_{OTA}$, whereupon the control signal $I_{OTA}$ can be smoothed for example by the low-pass filter mentioned.

Additionally, the amplitude-controlled oscillator circuit 300 illustrated in FIG. 3 has a constant current $I_{const}$ fed to the oscillator. In order to control the signal amplitude Ü of the frequency signal 102, a control current $I_{control}$ is formed from the constant feed current $I_{const}$ by the following formula:

$$I_{control} = I_{const} - I_{OTA}.$$

Furthermore, the amplitude-controlled oscillator circuit 300 comprises a stabilizing capacitor $C_{stabilizing}$ lowering a control speed of the amplitude control 120 and thus stabilizing the amplitude control and the amplitude control circuit illustrated in FIG. 3.

The mode of functioning of the amplitude control illustrated in FIG. 3 can be described as follows. At first, the oscillator circuit 300 is put into operation, wherein the oscillator outputs a frequency signal 104 having a signal amplitude Û by means of which a frequency division with the divider circuit does not result in a divided frequency signal 104 of the predetermined quality. The OTA amplifier can be controlled by the amplitude control 120, in particular by using the smoothed amplitude detection voltage $\overline{U}_{ampl}$ and the smoothed reference voltage $\overline{U}_{ref}$ such that the same outputs an amplifier current $I_{OTA}$ for increasing the signal amplitude Û of the oscillator. The oscillator can be controlled by this such that the same outputs, responsive to the amplifier current $I_{OTA}$, a signal amplitude Û of the frequency signal 102 where a frequency division using the divider circuit 200 results in a divided frequency signal 104 of the predefined quality.

Figure 4:
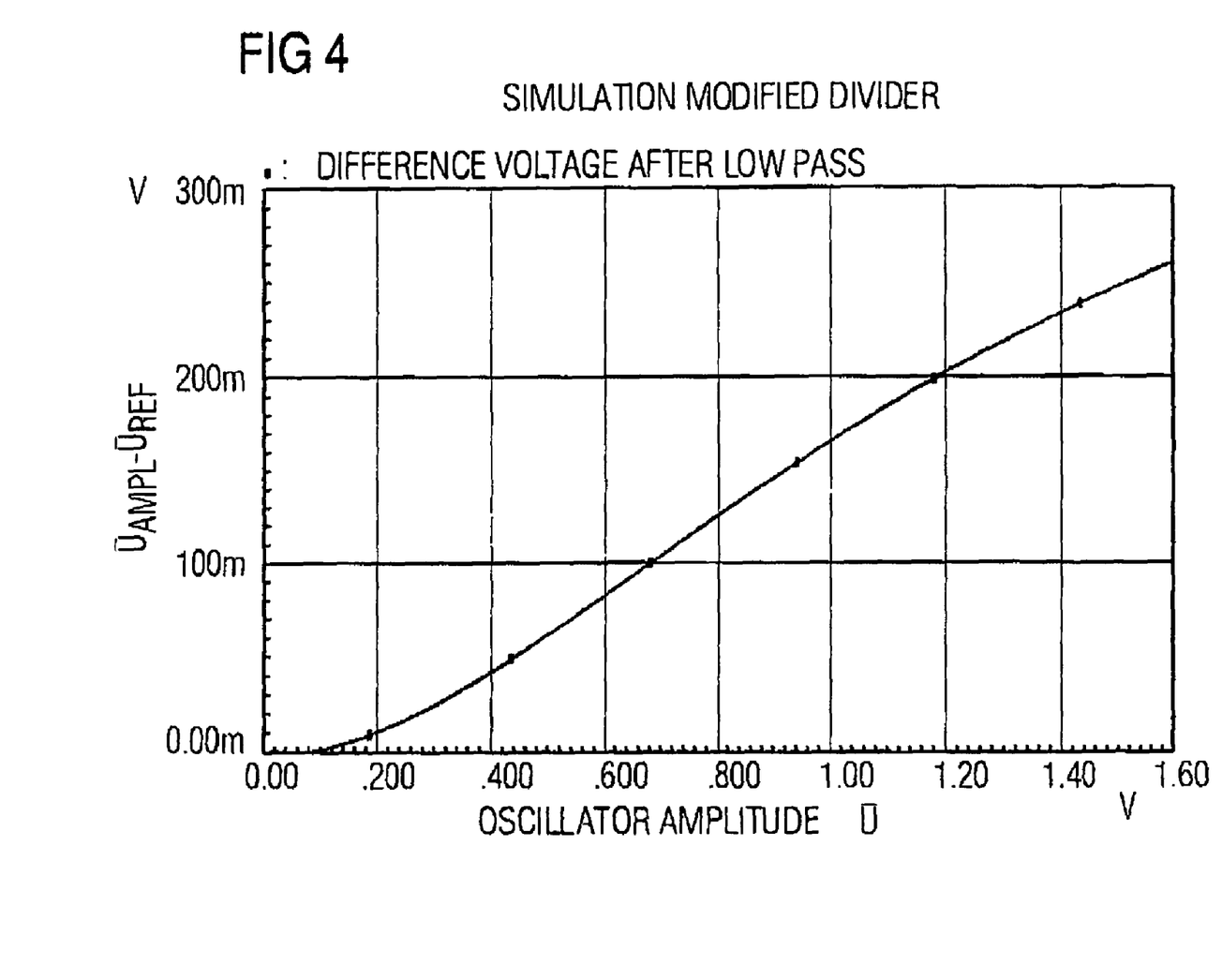
FIG. 4 shows a simulation diagram of a voltage using the divider circuit illustrated in FIG. 2.

FIG. 4 shows an exemplary simulation diagram illustrating a possible context of a difference of the smoothed amplitude detection voltage $\overline{U}_{ampl}$ and the smoothed reference voltage $\overline{U}_{ref}$ in dependence on the signal amplitude Û output by the oscillator. Here, the oscillator amplitude Û, i.e., the signal amplitude, is plotted on the abscissa in the unit of volts, while the difference voltage $\overline{U}_{ampl} - \overline{U}_{ref}$ after the low-pass filtering is plotted on the ordinate in mV. It can be seen from FIG. 4 that the difference voltage after the low-pass filter increases with an increasing oscillator amplitude Û.

Figure 5A:
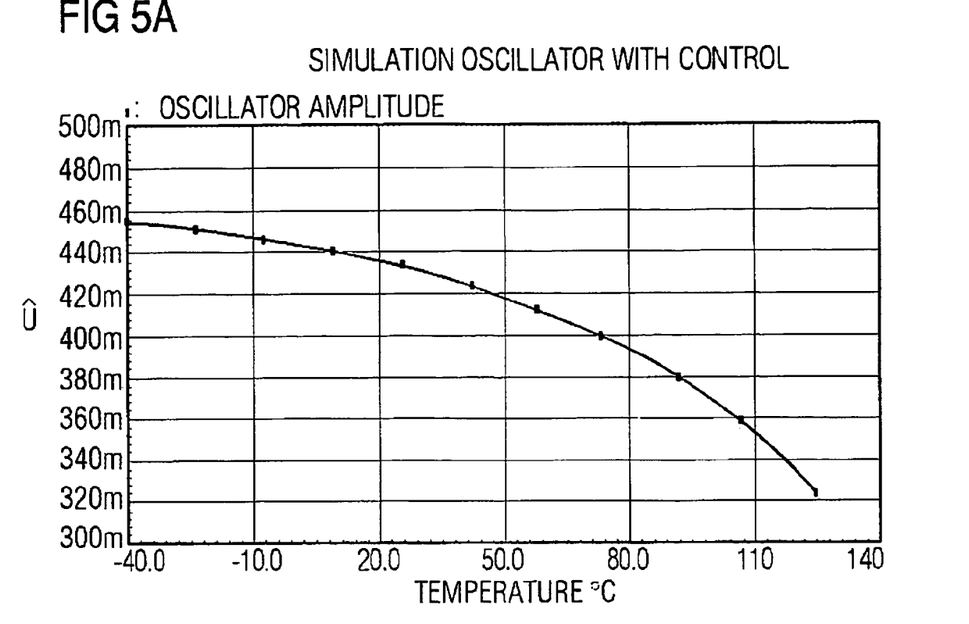
FIGS. 5A and 5B show two simulation diagrams illustrating the oscillator amplitude and the oscillator current against the temperature when using the divider circuit illustrated in FIG. 2.
Figure 5B:
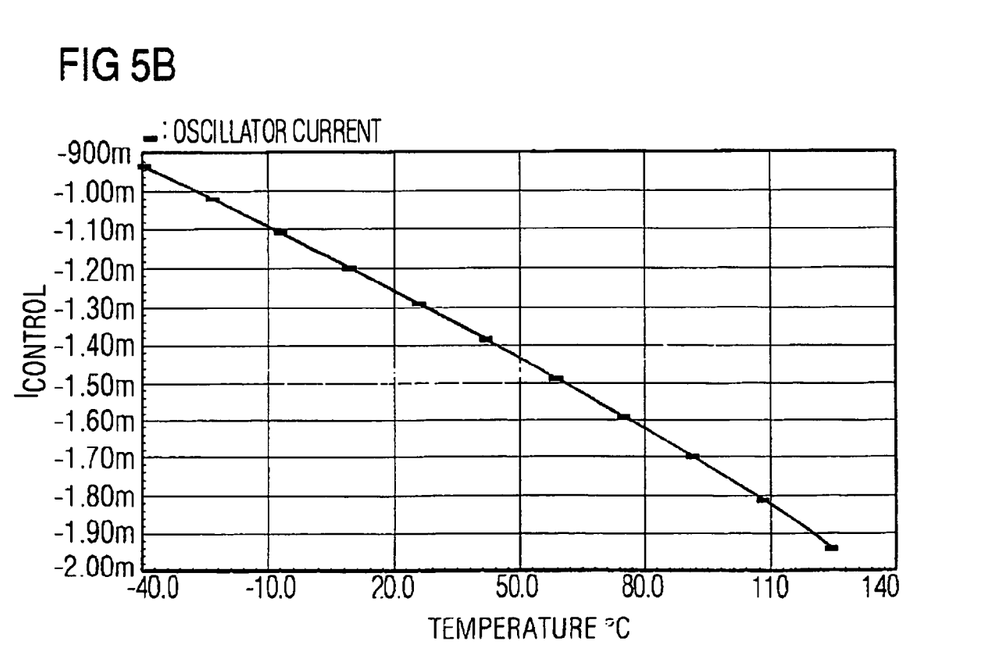

FIGS. 5A and 5B show simulation diagrams of the oscillator amplitude Û and the oscillator current $I_{control}$ with regard to temperature. A decreasing oscillating amplitude Û in relation to an increase in temperature can be seen in FIG. 5A. Thus, a considerably smaller variation bandwidth of the oscillator amplitude Û when using the amplitude control 120, in contrast to the variation bandwidth illustrated in FIG. 7A of a conventional oscillator circuit becomes obvious using the ordinate scaling, which contributes to a considerably better controllability and thus to a considerably better temperature characteristic of the inventive oscillator circuit. In FIG. 5B, the oscillator current $I_{control}$ in dependence on the temperature is illustrated using the amplitude-controlled oscillator circuit 300 detailed in FIG. 3. The greater variation width of the oscillator current $I_{control}$ with regard to the variation width illustrated in FIG. 7B of a conventional oscillator circuit becomes obvious here, from which a well-functioning control of the signal amplitude Û of the oscillator can be deduced.

Depending on the circumstances, the inventive method for operating an amplitude-controlled oscillator circuit can be implemented in hardware or software. The implementation can take place on a digital storage medium, in particular on a disc or CD having control signals which can be read out electronically which can cooperate with a programmable computer system such that the corresponding method will be executed. In general, the invention also relates to a computer program product having a program code stored on a machine-readable carrier for performing the inventive method when the computer program product runs on a computer. Put differently, the invention can also be realized as a computer program having a program code for performing the method when the computer program runs on a computer.

In summary, a control having an additional detector for the oscillator amplitude is avoided, which would have the disadvantage that further elements are required and that additional current is consumed. Most often, the detector is also an additional load which must be controlled by the oscillator. In oscillators downstream of which there is a divider (=divider circuit), these disadvantages could be avoided by means of modifying the divider. It is, for example, possible with this change to generate a difference voltage proportional to the oscillating amplitude Û of the oscillator. Thus, the voltage can be utilized for determining or controlling the amplitude.

This has the advantage that only few and small additional elements are required and that the additional current can be kept very small and that there is no further load by the oscillator. Furthermore, the additional area requirements compared to an additional detector can be kept small.

A conventional divider has the setup as is shown in FIG. 6. The modified divider comprises some additional elements, as is illustrated in FIG. 2. Thus, it is insignificant whether the divider is realized in MOS, NMOS, CMOS or in bipolar technology.

In this modified divider, the voltage $U_{ampl}$ is tapped as the base of the difference stage. The rectifying effect of the difference stage is utilized at this voltage and thus the result, approximately, is a rectified oscillator voltage.

On the other hand, a voltage $U_{ref}$ simulating the DC operating point, is generated in the divider via a smaller reference transistor $T_{ref}$. An additional current $I_0/n$ generated in an individual current source 202 passes through this reference transistor $T_{ref}$. It is important here that the current density in the reference transistor $T_{ref}$ be the same as in the respective operating transistors T1 to T4. This context is expressed by the relation n. Rather than with an individual reference transistor $T_{ref}$, a good matching behavior can also be obtained with many small individual transistors connected in series or in parallel. A large n is sought, but only to a level where edge effects of the transistors start interfering. Thus, stability with regard to temperature and the supply voltage can be achieved.

Both voltages generated from the divider are smoothed via a low-pass filter. The cut-off frequency thereof should be below the operating frequency $f_0$ of the oscillator. The difference of the voltages generated in this way is thus proportional to the oscillator amplitude $\hat{U}$ and is subsequently transformed into an equivalent current in the downstream OTA amplifier.

This current is used for controlling the VCO amplitude $\hat{U}$. The result is a control circuit keeping the amplitude $\hat{U}$ approximately constant.

The control circuit illustrated has a capacity $C_{stabilizing}$ diminishing the control speed and thus stabilizing the control circuit.

The actual control of the VCO amplitude takes place by the fed-in current $I_{control}$ generated by forming the difference with a constant $I_{const}$. This control current is multiplied by an internal current bank and is thus directly responsible for the amplitude in the resonance circuit. The amplitude can of course also be controlled in a different manner.

This kind of regulation is thus suitable for oscillators downstream of which there is a divider, as is in particular the case in PLLs (=phase-locked loops).

In summary, an amplitude-controlled oscillator circuit having an oscillator for providing a frequency signal having a voltage amplitude is defined by the invention, the voltage amplitude being controllable by a control quantity. Furthermore, the invention preferably includes a divider circuit for transforming the frequency signal, the divider circuit preferably including a transistor and the divider circuit being designed to provide a control signal and a reference signal, wherein the control signal depends on an alternating component of the frequency signal and the reference signal depends on the direct component of the frequency signal. In addition, the invention preferably includes a control circuit which is designed to provide the control quantity.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An amplitude-controlled oscillator circuit comprising:
   an oscillator for providing a frequency signal having a controllable signal amplitude, wherein the frequency signal includes a direct component;
   a divider circuit for a frequency division of the frequency signal, a minimum amplitude of the frequency signal being associated to the divider circuit and the divider circuit being formed to output a divided frequency signal having a predetermined quality when the signal amplitude is greater than or equal to the minimum amplitude, wherein the divider circuit additionally comprises a direct component detector for detecting the direct component and the direct component detector being formed to output a direct component direction signal; and
   a controller for controlling the signal amplitude of the frequency signal, the controller being formed to control the signal amplitude such that it is greater than or equal to the minimum amplitude.

2. The amplitude-controlled oscillator circuit according to claim 1, wherein the divider circuit additionally includes an amplitude detector for detecting the signal amplitude, the amplitude detector being formed to output an amplitude detection signal and the controller being formed to perform control based on the amplitude detection signal.

3. The amplitude-controlled oscillator circuit according to claim 2, wherein the controller includes a low-pass filter for filtering the amplitude detection signal, the low-pass filter being formed to provide a smoothed amplitude detection signal and the controller being formed to perform control based on the smoothed amplitude detection signal.

4. The amplitude-controlled oscillator circuit according to claim 3, wherein the controller includes an amplifier for amplifying the smoothed amplitude detection signal, the amplifier being formed to provide a control signal for controlling the controllable signal amplitude responsive to the smoothed amplitude detection signal.

5. The amplitude-controlled oscillator circuit according to claim 2, comprising a ground terminal, The amplitude detector including a transistor having a control terminal and a first and a second controlled terminal, the amplitude detection signal being a voltage between the second controlled terminal of the transistor and the ground terminal.

6. The amplitude-controlled oscillator circuit according to claim 5, wherein the transistor is an MOS transistor.

7. The amplitude-controlled oscillator circuit according to claim 3, wherein the low-pass filter is additionally formed to filter the direct component detection signal to provide a smoothed direct component signal.

8. The amplitude-controlled oscillator circuit according to claim 4, wherein the low-pass filter is additionally formed to filter the direct component detection signal to provide a smoothed direct component signal, wherein the amplifier is formed to provide the control signal responsive to a difference of the smoothed amplitude detection signal and the smoothed direct component signal.

9. The amplitude-controlled oscillator circuit according to claim 5, wherein the direct component detector includes a reference transistor having a control terminal and a first and a second controlled terminal, the control terminal of the transistor being coupled to the control terminal of the reference transistor, the first controlled terminal of the transistor being coupled to the first controlled terminal of the reference transistor, the second controlled terminal of the reference transistor being coupled to the ground terminal via a current source and the direct component signal being a voltage between the second controlled terminal of the reference transistor and a potential of the ground terminal.

10. The amplitude-controlled oscillator circuit according to claim 9, wherein the reference transistor is an MOS transistor.

11. The amplitude-controlled oscillator circuit according to claim 10, wherein the divider circuit includes a current source for providing a current through the transistor and a reference current source for providing a reference current through the reference transistor, a relation of the reference current and the current depending on a relation of a quotient of a channel width and a channel length of the reference transistor and a quotient of a channel width and a channel length of the transistor.

12. The amplitude-controlled oscillator circuit according to claim 1, wherein the direct component detector includes at least one other reference transistor connected in parallel or in series to the reference transistor.

13. The amplitude-controlled oscillator circuit according to claim 1, wherein the divided frequency signal has the predetermined quality when a voltage level of the divided frequency signal has a minimum amplitude between a first predefined switching level and a second predefined switching level, the first switching level corresponding to a supply voltage applicable to the amplitude-controlled oscillator circuit and the second switching level being lower than the first switching level.

14. The amplitude-controlled oscillator circuit according to claim 1, wherein the minimum amplitude equals 200 mV.

15. A phase-locked loop comprising:
an amplitude-controlled oscillator circuit comprising:
   an oscillator for providing a frequency signal having a controllable signal amplitude, wherein the frequency signal includes a direct component;
   a divider circuit for a frequency division of the frequency signal, a minimum amplitude of the frequency signal being associated to the divider circuit and the divider circuit being formed to output a divided frequency signal having a predetermined quality when the signal amplitude is greater than or equal to the minimum amplitude, wherein the divider circuit additionally comprises a direct component detector for detecting the direct component and the direct component detector being formed to output a direct component detection signal; and
   a controller for controlling the signal amplitude of the frequency signal, the controller being formed to control the signal amplitude such that it is greater than or equal to the minimum amplitude.

16. A method for operating an amplitude-controlled oscillator circuit, the amplitude-controlled oscillator circuit including an oscillator for providing a frequency signal having a controllable signal amplitude, wherein the frequency signal includes a direct component, a divider circuit for a frequency division of the frequency signal, a minimum amplitude of the frequency signal being associated to the divider circuit and the divider circuit being formed to output a divided frequency signal of a predetermined quality when the signal amplitude is greater than or equal to a minimum amplitude, wherein the divider circuit additionally comprises a direct component detector for detecting the direct component and the direct component detector being formed to output a direct component detection signal, and a controller for controlling the signal amplitude of the frequency signal, the controller being formed to control the signal amplitude such that it is greater than or equal to the minimum amplitude, comprising the following steps:

providing the frequency signal using the oscillator wherein the frequency signal includes the direct component;

dividing the frequency signal using the divider circuit to provide a divided frequency signal having a poorer quality than the predetermined quality, wherein the dividing additionally comprises a detecting of the direct component outputting a direct component detection signal; and controlling the signal amplitude of the frequency signal such that the divided frequency signal achieves the predetermined quality.

17. A computer program having a program code for performing a method for operating an amplitude-controlled oscillator circuit, the amplitude-controlled oscillator circuit including an oscillator for providing a frequency signal having a controllable signal amplitude, wherein the frequency signal includes a direct component, a divider circuit for a frequency division of the frequency signal, a minimum amplitude of the frequency signal being associated to the divider circuit and the divider circuit being formed to output a divided frequency signal of a predetermined quality when the signal amplitude is greater than or equal to a minimum amplitude, wherein the divider circuit additionally comprises a direct component detector for detecting the direct component and the direct component detector being formed to output a direct component detection signal, and a controller for controlling the signal amplitude of the frequency signal, the controller being formed to control the signal amplitude such that it is greater than or equal to the minimum amplitude, comprising the following steps: providing the frequency signal using the oscillator, wherein the frequency signal includes a direct component; dividing the frequency signal using the divider circuit to provide a divided frequency signal having a poorer quality than the predetermined quality, wherein the dividing additionally comprises a detecting of the direct component outputting a direct component detection signal; and controlling the signal amplitude of the frequency signal such that the divided frequency signal achieves the predetermined quality, when the program runs on a computer.

* * * * *